United States Patent [19]

Ettenberg et al.

[11] Patent Number: 4,903,275
[45] Date of Patent: Feb. 20, 1990

[54] PHASE MODULATION SEMICONDUCTOR LASER ARRAY

[75] Inventors: Michael Ettenberg, Freehold; Donald B. Carlin, Robbinsville, both of N.J.

[73] Assignee: General Electric Company, Schenectady, N.Y.

[21] Appl. No.: 325,805

[22] Filed: Mar. 20, 1989

[51] Int. Cl.$^4$ ............................ H01S 3/19; H01S 3/13
[52] U.S. Cl. ........................................ 372/50; 372/45; 372/46; 372/48; 372/96; 372/26; 372/28; 372/29; 372/32
[58] Field of Search ........................ 372/50, 45, 46, 44, 372/43, 96, 97, 48, 18, 20, 26, 28, 29, 32, 33

[56] References Cited

U.S. PATENT DOCUMENTS

| | | | |
|---|---|---|---|
| 4,101,845 | 7/1978 | Russer | 372/26 |
| 4,331,938 | 5/1982 | Limm et al. | 372/50 |
| 4,412,234 | 10/1983 | Matsuda et al. | 357/17 |
| 4,547,396 | 10/1985 | Botez et al. | 427/87 |
| 4,622,671 | 11/1986 | Tsang | 372/26 |
| 4,641,311 | 2/1987 | Ackley | 372/18 |
| 4,669,086 | 5/1987 | Kaede et al. | 372/50 |
| 4,723,252 | 2/1988 | Botez et al. | 372/50 |
| 4,773,076 | 9/1988 | Yamamoto et al. | 372/48 |
| 4,788,689 | 11/1988 | Tokuda et al. | 372/50 |
| 4,797,891 | 1/1989 | Uomi et al. | 372/48 |

FOREIGN PATENT DOCUMENTS 0128583 6/1987 Japan ........................................ 372/43

OTHER PUBLICATIONS

Appl. Phys. Lett. 42(2) "Single Longitudinal mode operation of high power multiple-stripe injection lasers" D. E. Ackley (Jan. 15, 1983).

*Primary Examiner*—William L. Sikes
*Assistant Examiner*—Georgia Y. Epps
*Attorney, Agent, or Firm*—James C. Davis, Jr.; Paul R. Webb, II

[57] ABSTRACT

A phase-locked semiconductor laser array is dephased-locked by forming at least two p-type contacts electrically isolated from one another coupled to one side of the active region and a single contact layer coupled to the other side of the active region. The same current is applied to two p-type contacts to form a single phase-locked far-field lobe. A different current is applied to one of the two p-type contacts to drive one contact harder than the other to form a dephased multiple lobe beam. An effective aperture at the receiver receives the in-phase single lobe and blocks the multiple lobes to produce a modulation effect at the receiver.

11 Claims, 2 Drawing Sheets

PHASE MODULATION SEMICONDUCTOR LASER ARRAY

This invention relates to a monolithic array of semiconductor lasers adapted for selective amplitude modulation.

A semiconductor injection laser typically comprises a body of semiconductor material having a thin active layer between cladding regions of opposite conductivity type. To increase the output power, a guide layer having a refractive index which is intermediate the active and cladding layers may be interposed between one of the cladding regions and the active region. Light generated in the active layer propagates in both the active and guide layers thereby forming a larger beam at the emitting facet of the body. The cavity region comprising an active layer or the combination of a guide layer and an active layer restricts oscillation in the transverse direction, the direction perpendicular to the plane of the layers, to the fundamental optical mode. In the lateral direction, the direction in the plane of the layers and perpendicular to the axis of light propagation, it is useful to introduce structural variations which produce an optical waveguide which in turn restricts the oscillation to the fundamental optical mode. Lasers incorporating transverse and lateral waveguides, such as that disclosed by Botez in U.S. Pat. No. 4,347,486, incorporated herein by reference, may have output powers in excess of about 40 milliwatts in the fundamental lateral and transverse modes.

To increase the output power in the laser beam beyond the capability of such an individual laser, monolithic arrays of spaced-apart laser devices, such as that disclosed by Botez et al. in U.S. Pat. No. 4,547,396, incorporated herein by reference, have been fabricated wherein the modes of oscillation of the individual lasers are coupled to one another to form a single phase-locked coupled oscillator. Such arrays that operate in a single longitudinal mode have been observed to have output powers as high as 80 milliwatts.

In optical communication systems, such lasers need to be modulated. However, the modulation is difficult at frequencies in excess of a gigahertz. The modulation of phase-locked arrays of semiconductor diode lasers at frequencies in excess of a gigahertz is difficult for at least two reasons. The individual lasing elements of the array are in parallel, therefore the capacitance of the device is multiplied by the number of elements and the modulation bandwidth is, therefore, decreased compared to individual lasers of the same design. In addition, the current required to turn the device on and off (amplitude modulation) increases commensurately.

Phase-locked arrays, however, lend themselves to a type of amplitude modulation not available with individual diode lasers. The great problem with phase-locked arrays has been the generation of a single-lobed diffraction-limited beam. Minor perturbations to the locking mechanism, however, will cause the single-lobed array emission either to steer, so that the direction of propagation is no longer coincident with the optic axis, or to degrade into multiple-lobed beams. In either case, the array emission will no longer fall within the field-of-view of the collimating optics of the transmission system. The present inventors recognize that this general mechanism in which the emission falls outside the field-of-view of the collimating optics may prove useful in certain amplitude modulation communication links.

A semiconductor laser array according to the present invention comprises a body of semiconductor material having first and second reflecting surfaces with at least the first reflecting surface being partially transparent to laser wavelength so that light may be emitted therefrom. The body includes a substrate with first and second opposed planar major surfaces. A plurality of index guide means are connected to the first major surface and extend between the reflecting surfaces. A first cladding layer overlies the first major surface of the substrate and the index guide means. A laser cavity region overlies the first cladding layer and a second cladding layer overlies the laser cavity region. First and second electrical contacts are coupled to the second cladding layer and to the second major surface of the substrate, respectively, wherein each index guide means is spaced from the adjacent guide means a distance such that laser oscillations over the adjacent guide means are phased-locked to one another upon application of a given current to the contacts. The first contacts include a plurality of spaced electrically isolated contacts extending parallel to the index guide means and adapted to receive corresponding currents for selectively causing dephase modulation of the light emitted by the array. This dephase modulation avoids the need for applying relatively high currents to turn the device on and off for amplitude modulation.

BRIEF DESCRIPTION OF THE DRAWINGS

In the different FIGURES the same elements of the laser array of the invention have the same numerical identification.

In FIG. 1, a laser array 10 according to one embodiment of the invention comprises a body 12 of single crystalline semiconductor material having spaced, parallel reflecting surfaces 14(a) and (b), with the reflecting surface 14(a) being partially transparent so that laser light may be emitted therefrom. The body 12 also includes spaced, substantially parallel side surfaces 16 which extend between and are perpendicular to the reflecting surfaces 14(a) and (b).

Figure 1:
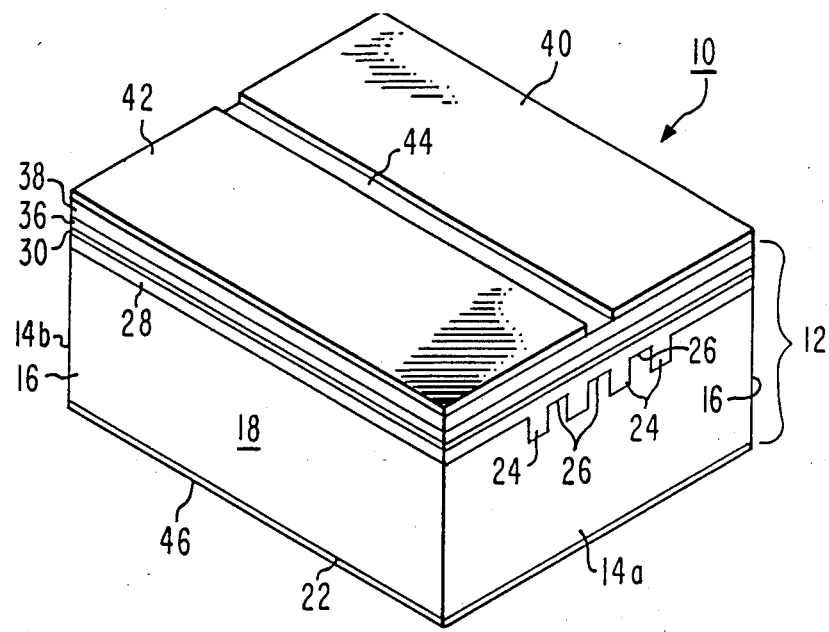
FIG. 1 is an isometric view of a laser array according to one embodiment of the present invention.

The semiconductor body 12 includes a substrate 18 having first and second planar major surfaces 20 and 22, respectively, which extend between and are perpendicular to both the reflecting surfaces 14(a) and (b) and the side surfaces 16. The first major surface 20 comprises a mesa with a plurality of spaced, substantially parallel channels 24 extending a distance into the surface 20 with lands 26 therebetween. A first cladding layer 28 overlies the surfaces of the substrate 20 and lands 26 and fills the channels 24. A cavity region comprises an active layer 30 overlying the first cladding layer 28. A second cladding layer 36 overlies the second cladding layer 36. In the alternative, the cavity region may comprise a guide layer overlying the layer 26 as shown in U.S. Pat. No. 4,641,311, incorporated by reference herein, and an active layer overlyng the guide layer. Electrical contacts 40 and 42 overlie the capping layer 38. A second electrical contact 46 overlies the second major surface 22 of the substrate 18. In an alternative embodiment, an insulating layer (not shown) may be between contacts 40 and 42 in regions external the channels between the channels and the sides 16, for example, as shown in U.S. Pat. No. 4,641,311.

Contacts 40 and 42 extend parallel to channels 24 and are spaced apart by a gap 44. Gap 44 electrically isolates contacts 40 and 42 so that currents of different values may be applied to those contacts. For example, a current of one value $I_1$, e.g., 100 ma, may be applied to contact 40 and a current of a second value $I_2$ may be applied to contact 42, current $I_1$ may have a constant value while the current $I_2$ may have differing values to modulate the array by dephasing the the lasers of the array. One value of current $I_2$ is the same as current $I_1$. A second value differs from the value of current $I_1$ sufficiently to dephase-lock the lasers of the array, e.g., about 10% or more of the value of current $I_1$.

Figure 2:
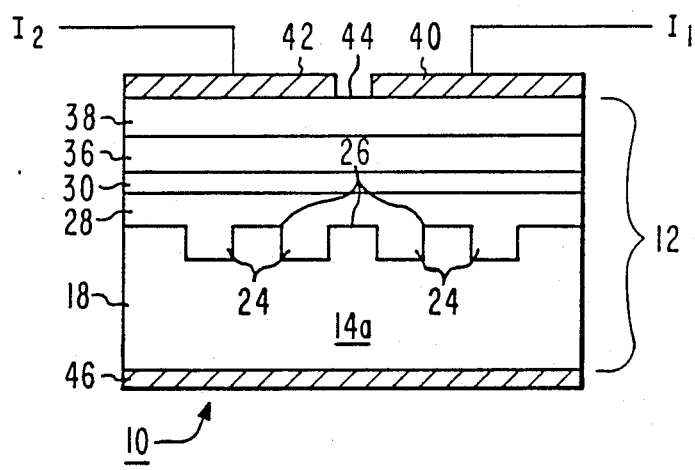
FIG. 2 is a sectional elevation view of the array of the embodiment of FIG. 1.

The dephasing of an in-phase array can occur by a variety of mechanisms. For evanescently coupled arrays, the contacts 40 and 42, FIGS. 1 and 2, are on the p-side of the device. Slight variations in the amplitude of the drive current to one of these contacts changes the relative gains of the array modes so than an out-of-phase mode predominates. This approach may also be possible with waveguide-coupled arrays (such as Y-guides), where the mode propagation constants of the waveguide depend on the injection current. Slight changes in the waveguide, effected by injecting different current amplitudes into separate contacting areas, perturb the optical mode sufficiently to force the array into an out-of-phase operation.

The alloys used for the particular layers of the array should be such that the refractive index of the active layer 30 is greater than the refractive index of the guide layer (if used) which in turn is greater than the refractive index of the cladding layers 28 and 36. The laser array may be formed of materials such as GaAs and AlGaAs which have the requisite refractive index differences. Alternatively, alloys of other Group III or V elements such as In, Ga, P, Sb and As may be used. The substrate 18 and the first cladding layer 28 are of one conductivity type and the second cladding layer 36 and the capping layer 38 are of the opposite conductivity type.

In operation of the array 10, bias voltages of the proper polarity are applied to the electrical contacts 40, 42 and 44, producing laser action over each channel in the cavity region. Light propagates in the active layer with the evanescent tails of this radiation distribution extending into the cladding layers in the transverse direction. The lateral variation in the separation between the cavity region and the substrate over the channels produces a lateral variation in the transverse refractive index thereby forming a local index guide for light propagation over each channel.

Figure 5:
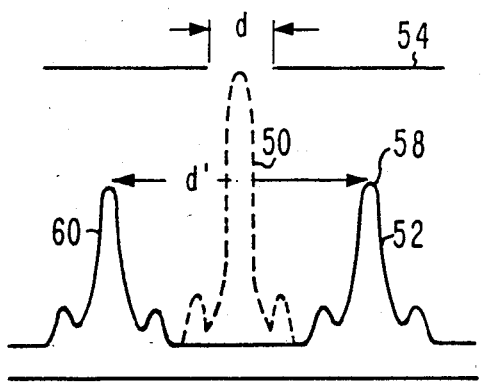
FIG. 5 is a diagram of laser waveforms emitted by the laser array of the embodiment of FIG. 1.

In FIG. 5, the far field pattern is illustrated for the laser array 10 of FIG. 1. Curve 50, the pattern shown in dashed lines, is produced by the array 10 when the currents applied to the contacts 40 and 42 have the same value, i.e., $I_1$ equals $I_2$. The array 10, with the currents at the same value, behaves as an ordinary phase-lock array as discussed in the prior art such as in U.S. Pat. No. 4,547,396. By changing the current to the contact 42 so that the current $I_2$ applied to this contact differs from the current $I_1$ applied to contact 40 by at least about 10%, dephasing of the light emitted by the array of lasers of the array 10 occurs. This dephasing operation serves to shift the far field pattern to a multiple lobe beam, curve 52, FIG. 5.

Figure 3:
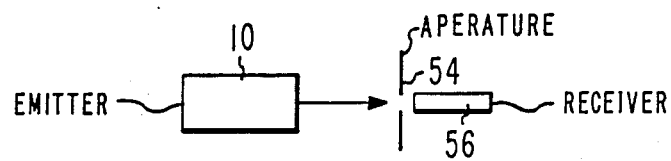
FIG. 3 is a schematic diagrammatic view of an optical system incorporating the array of the embodiment of FIG. 1.

Spaced from the array 10, FIG. 3, is an effective aperture 54. This aperture is between the array 10 and a light receiver 56. The aperture 54, FIG. 5, has a diameter d (FIG. 5) smaller than the spacings of the next adjacent lobes 58 and 60 of curve 52. For example, lobes 58 and 60 may be spaced a distance d'. Distance d is smaller than d' so that aperture 54 effectively blocks the reception of the light of lobes 58 and 60 by the receiver 56, FIG. 3.

When the currents $I_1$ and $I_2$ applied to the contacts 40 and 42 are made the same, then the single lobe curve 50, FIG. 5 is centrally positioned with respect to the aperture 54 and passes through the opening therein to the receiver 56, FIG. 3. While the aperture 54 is shown as a separate device, this is illustrated for purposes of explanation. The receiver 56, for example, may comprise receiving optics including, for example, a receiving telescope lens system. The receiving lens system may act as an effective aperture in that these optics have a finite diameter. If the finite diameter of the receiving optics has a diameter d, FIG. 5, then the optics act as an effective aperture similar to the opening in aperture 54. In this case, no separate aperture device need be provided in front of the receiving optics. The lobe of curve 50, FIG. 5, may be a collimated beam passing through the optics of the transmission system. This beam if in the form of curve 50 has a finite diameter which is no greater than the diameter of the receiving optics including the telescope lens and other optical elements. The lobe of curve 50 therefore would be received entirely by the receiving optics when transmitted in this form. When a modulating current is applied to one of the contacts 40 and 42 the light produced by the laser array 10 is dephased. The multiple lobes including lobes 58 and 60 are spaced apart a distance d' greater than the diameter of the receiving optics and, therefore, effectively are not received by the receiver. By shifting the value of the current applied to one of the contacts such as contact 42 relative to the other contact, such as contact 40, a relatively small current value, dephasing occurs which effectively results in modulation of the emitted light. This modulation may be in excess of a gigahertz and therefore does not require relatively large turn-on currents for the laser array.

While the principles of the invention have been described with relation to the laser arrays 10 of FIG. 1, it is to be understood that these principles are equally applicable to any laser array wherein the lasing regions are centered over channels in the substrate or one of the overlying layers. For example, ridge guided or buried channel arrays may be employed in the alternative.

A laser array embodying the principles of the invention may be fabricated using well-known photolithographic masking and etching techniques to form the channels followed by standard epitaxy techniques to deposit the layers over the surface containing the channels. Etching techniques to form the channels may include selective chemical etching of a surface having a particular crystallographic orientation or ion etching using techniques well known in the art.

The substrate 18 is preferably composed of N-type GaAs having a first major surface 20 which is parallel to or slightly misoriented from the (100) crystallographic plane. The channels 24 are preferably uniformly spaced and are typically between about 1.5 and 2.5 micrometers ($\mu$m) deep, having a width at the surface 20 between about 3 and 4 $\mu$m with a typical center-to-center spacing between about 4 and 6 $\mu$m. Larger center-to-center spacings may also be useful in which case the other dimensions change accordingly. The channels 24 are vee-shaped with planar surface lands 26 therebetween but may have another shape. It is to be understood that the substrate 18 is also meant to include an epitaxial layer on the surface 20 in which the channels 24 are formed.

The first cladding layer 28 is typically composed of N-type $Al_rGa_{1-r}As$ where r is between about 0.20 and 0.45 and preferably between about 0.25 and 0.35. This layer is comparatively thin over the lands between the channels 24 being between about 0.1 and 0.4 $\mu$m thick and producing a planar layer surface of the first cladding layer 28 upon which the succeeding layers are deposited. Alternatively, the deposition of the first cladding layer 28 is controlled so that the channels 24 are not filled thereby producing a curved surfaces of the first cladding layer 28 in the channels.

A guide layer, overlying layer 28, may be composed of N-type $Al_xGa_{1-x}As$ where x is between about 0.15 and 0.30 and preferably between 0.18 and 0.25. This layer is typically planar and is between about 0.3 and 0.6 $\mu$m thick and preferably about 0.4 $\mu$m thick. If the layer is non-planar, it is typically between about 0.3 and 0.6 $\mu$m thick over the channels and between about 0.1 and 0.4 $\mu$m thick over the lands between the channels.

The active layer 30 is composed of $Al_yGa_{1-y}As$ where y is between about 0.0 and 0.15, and preferably between about 0.03 and 0.12 and is preferably undoped. If the active layer 30 is planar, it is typically between about 0.05 and 0.12 $\mu$m thick. If it is formed on a curved surface it is typically between about 0.05 and 0.12 $\mu$m thick over the channels and thinner but nonzero over the planar lands 26 between the channels 24.

The second cladding layer 36 is between about 0.18 and 1.5 $\mu$m thick and is composed of P-type $Al_zGA_{1-z}As$ where z is between about 0.25 and 0.45, and preferably between 0.28 and 0.35.

The capping layer 38 is between about 0.5 and 1.0 $\mu$m thick and is composed of P-type GaAs and is used to facilitate ohmic electrical contact between the underlying semiconductor material and the overlying metal contact.

An electrically insulating layer, if used, is preferably composed of silicon dioxide which is deposited on the capping layer 38 by pyrolytic decomposition of a silicon-containing gas, such as silane, in oxygen or water vapor. An opening is formed through the electrically insulating layer down to the capping layer 38 over the channels 24 using standard photolithographic masking techniques and etching processes. A broad area electrical contact forming contacts 40 and 42 is deposited as a single layer over the capping layer 38. The gap 44 is preferably formed by ion milling to a transverse spacing of about 2-4 $\mu$m. The broad area electrical contact is preferably composed of sequentially evaporated titanium, platinum, and gold. The substrate electrical contact 46 is deposited on the major surface 22 of the substrate 18 by sequentially evaporation of germanium, gold, nickel and gold followed by a sintering step.

The reflecting surface 14(a) of the array is coated with a layer of $Al_2O_3$ or a similar material having an optical thickness of about one-half wave at the lasing wavelength as disclosed by Ladany et al. in U.S. Pat. No. 4,178,564 or a coating having an optical thickness of one-quarter wave. The reflecting surface 14(b) is coated with a reflector consisting of an electrical insulator such as $SiO2$ coated with a layer of gold as disclosed by Capian et al. in U.S. Pat. No. 3,701,047. Alternatively, the mirror may be a muttilayer reflector such as that disclosed by Ettenberg in U.S Pat. No 4,092,659.

Figure 4:
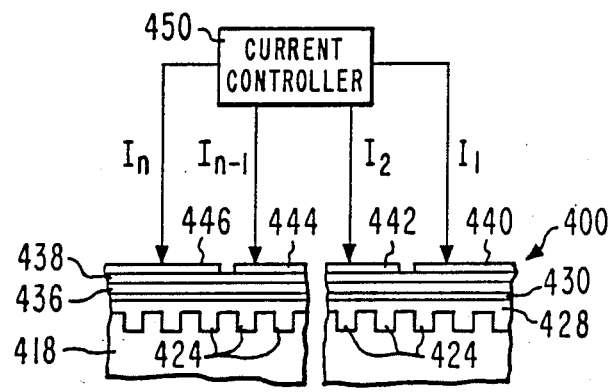
FIG. 4 is a sectional elevation view of a second of a laser array according to a second embodiment of the present invention.

In FIG. 4, a second embodiment of a laser array according to the present invention is as shown. Array 400 comprises a substrate 418 in which are formed a plurality of channels 424. Overlying the channels 424 is a first cladding layer 428. Overlying the first cladding layer 428 is an active layer 430. Overlying the active layer 430 is a second cladding layer 436. A capping layer 438 overlies the second cladding layer. A plurality of contacts 440, 442, 444, 446 and so on, overlie the capping layer 438. Contact 446 represents the nth contact of a plurality of contacts placed over the laser array 400. The composition and structure of the different layers may be identical to the composition and structure of the layers in the laser array 10, FIG. 2. Controller 450 applies bias voltages to the different contacts 440-446 to create currents $I_1$ to $I_n$ applied to the respective different laser devices. A first current $I_1$ is applied to contact 440, a second current $I_2$ is applied to contact 442, an $I_{n-1}$ current is applied to contact 444 and a nth current is applied to contact 446. These currents $I_1$-$I_n$ may be at the same value to provide a phase-locked emitted beam whose far-field radiation has a single lobe represented by curve 50, FIG. 5. The currents $I_2$, $I_{n-1}$ and $I_n$ may be shifted in value to produce different curve characteristics as may be desired for a given implementation. The currents may be provided, for example, different values to provide a steering action by controlling the nature and number of farfield lobes produced by the emitted radiation. These lobes are then filtered by an appropriate aperture corresponding to aperture 54, for example, FIG. 3, but having different spaced openings therein for receiving the different lobes created by the different currents applied to the array 400. In this way, a plurality of different modulations may be provided the emitted radiation to achieve a number of different far-field effects. The currents may be applied in alternate fashion, interleaved or in separate regions, each region containing one or more contacts in accordance with the resulting emitted beam characteristics as desired. For example, the current $I_1$ and the alternate current $I_3$ (not shown) ... and so on may all have the same current value. The alternate contacts receivihg the current $I_2$, $I_4$ ... and so on may receive a current that is the same as current $I_1$ in one mode for producing an in-phase single lobe beam and of a different current value to produce a dephased beam having multiple lobes.

What is significant in the present invention is that the number of index guided structures employed may vary from two to a greater number in accordance with a particular implementation. It is important therefore that there be at least two index guided structures in the laser array. However, the form of the index guided structure may differ among the different embodiments. For example, one embodiment may be the channelled substrate planar structure as described, a ridge guided structure as mentioned above, a buried structure construction or an inverse channelled substrate planar (CSP) structure which may be formed by metal organic chemical vapor deposition (MOCVD). It is important that there be at least two electrodes to drive some of the elements harder than others in the given laser array. It is also important that the optical system receive the beam emitted by the laser array embodied in the present invention include an effective aperture structure for providing a filtering means for distinguishing between the multiple lobes when the currents applied to the different contacts of the array differ as compared to the single lobe beam when the currents applied to the contacts are the same.

What is claimed is:

1. A semiconductor laser array comprising;
    a body of semiconductor material having first and second reflecting surfaces with at least said first reflecting surface being partially transparent at the laser wavelength so that light may be emitted therefrom; said body including:
    a substrate with first and second opposed planar major surfaces;
    a plurality of index guide means connected to the first major surface and extending between the reflecting surfaces;
    a first cladding layer overlying the first major surface of the substrate and said index guide means;
    a laser cavity region overlying the first cladding layer;
    a second cladding layer overlying the laser cavity region; and
    first and second electrical contacts coupled to the second cladding layer and the second major surface of the substrate respectively;
    wherein each index guide means is spaced from adjacent guide means by a distance such that laser oscillations adjacent to said guide means are phase-locked to one another upon application of a given current to said contacts;
    said first contacts including a plurality of spaced electrically isolated contacts extending parallel to said index guide means and adapted to selectively receive corresponding currents for selectively causing dephase modulation of said light emitted by said array.

2. The array of claim 1 further including means for applying said dephase modulation currents to said first 3. The array of claim 1 including at least two of said index guide means.

4. The array of claim 1 wherein said index guide means includes a plurality of substantially parallel channels with lands therebetween on the first major surface.

5. The array of claim 1 including means for applying a plurality of different modulation currents to respective corresponding different ones of said first contacts.

6. The array of claim 1 further including means for receiving said emitted light, said receiving means including means acting effectively as an aperture for effectively permitting only said phased-locked light to be received.

7. The array of claim 1 wherein said index guide means includes a plurality of substantially parallel ridges with lands therebetween coupled to the first major surface.

8. The array of claim 1 further including current applying means for applying a first current to a first portion of said first contacts and a second current to a second portion of said first contacts, said current applying means including means for selectively applying a current to said first portion different than the current applied to said second portion in a first period and applying a current to said first and second portions of the same value in a second period.

9. The array of claim 8 wherein the first portion of contacts is spaced from the second portion.

10. The array of claim 8 wherein the first portion of contacts are interleaved with the second portion.

11. A semiconductor laser array comprising:
    a body of semiconductor material having first and second reflecting surfaces with at least said first reflecting surface being partially transparent at the laser wavelength so that light may be emitted therefrom; said body including;
    a substrate with first and second opposed planar major surfaces;
    a plurality of substantially parallel channels with lands therebetween in first major surface and extending between the reflecting surfaces;
    a first cladding layer overlying the first major surface of the substrate and the channels;
    a laser cavity region overlying the first cladding layer;
    a second cladding layer overlying the laser cavity region; and
    first and second electrical contacts coupled to the second cladding layer and second major surface of the substrate respectively;
    wherein each channel is spaced from adjacent channels by a distance such that laser oscillations over said adjacent channels tend to be phase-locked to one another upon application of a given current to said contacts; and
    said first contacts including a plurality of spaced electrically isolated contacts extending parallel to said channels and adapted to receive corresponding current for selectively causing dephase modulation of said light emitted by said array.

* * * * *